United States Patent
Li

(10) Patent No.: US 10,777,123 B2
(45) Date of Patent: Sep. 15, 2020

(54) MICRO LIGHT EMITTING DIODE DISPLAY PANEL AND DRIVING METHOD THEREOF

(71) Applicant: PlayNitride Inc., Tainan (TW)

(72) Inventor: Yu-Chu Li, Tainan (TW)

(73) Assignee: PlayNitride Inc., Hsinchu County (TW)

(*) Notice: Subject to any disclaimer, the term of this patent is extended or adjusted under 35 U.S.C. 154(b) by 0 days.

(21) Appl. No.: 16/121,634

(22) Filed: Sep. 5, 2018

(65) Prior Publication Data

US 2019/0073944 A1   Mar. 7, 2019

(30) Foreign Application Priority Data

Sep. 7, 2017   (TW) .............................. 106130555 A

(51) Int. Cl.
*G09G 3/32*      (2016.01)
*G09G 3/20*      (2006.01)
*H01L 25/075*    (2006.01)
*H01L 27/15*     (2006.01)

(52) U.S. Cl.
CPC .............. *G09G 3/32* (2013.01); *G09G 3/2003* (2013.01); *G09G 2300/0443* (2013.01); *G09G 2300/0452* (2013.01); *G09G 2310/0264* (2013.01); *G09G 2320/0242* (2013.01); *H01L 25/0753* (2013.01); *H01L 27/156* (2013.01)

(58) Field of Classification Search
CPC ..................................................... H01L 27/156
See application file for complete search history.

(56) References Cited

U.S. PATENT DOCUMENTS

| 7,221,349 | B2* | 5/2007 | Hashido ................. G09G 3/325 315/169.1 |
| 8,109,440 | B2* | 2/2012 | Constant, Jr. ...... H04N 1/00013 235/438 |
| 10,337,917 | B2* | 7/2019 | Bilenko .................... G01J 3/12 |
| 2008/0198180 | A1* | 8/2008 | Langendijk .......... G09G 3/2003 345/690 |

(Continued)

FOREIGN PATENT DOCUMENTS

| CN | 1738496 | 2/2006 |
| CN | 1941029 | 4/2007 |

(Continued)

OTHER PUBLICATIONS

"Office Action of China Counterpart Application", dated Jun. 2, 2020, p. 1-p. 11.

*Primary Examiner* — William A Harriston
(74) *Attorney, Agent, or Firm* — JCIPRNET

(57) ABSTRACT

A micro light emitting diode display panel including a plurality of pixels and a control element is provided. One of the pixels include a first sub-pixel. The first sub-pixel includes two micro light emitting diodes having different light wavelengths and controlled independently. The control element controls driving currents to the two micro light emitting diodes according to a gray level of the first sub-pixel, wherein a ratio of the driving current of the micro light emitting diode with larger light wavelength to the driving current of the micro light emitting diode with smaller light wavelength increases as the gray level of the first sub-pixel increases. A driving method of the micro light emitting diode display panel is also provided.

11 Claims, 2 Drawing Sheets

(56) References Cited

U.S. PATENT DOCUMENTS

| | | | | |
|---|---|---|---|---|
| 2010/0259519 | A1* | 10/2010 | Chen | G02F 1/13624 345/206 |
| 2012/0091882 | A1* | 4/2012 | Haase | H01L 33/08 313/498 |
| 2014/0159067 | A1* | 6/2014 | Sakariya | H01L 33/62 257/88 |
| 2014/0159613 | A1* | 6/2014 | Chakravarti | H05B 45/20 315/297 |
| 2014/0368561 | A1* | 12/2014 | Liao | G09G 3/2014 345/692 |
| 2015/0091950 | A1* | 4/2015 | Park | G09G 3/3208 345/690 |
| 2015/0371585 | A1* | 12/2015 | Bower | H01L 33/385 345/1.1 |
| 2016/0064363 | A1* | 3/2016 | Bower | H01L 25/167 315/294 |
| 2016/0329010 | A1* | 11/2016 | Sun | G02F 1/1368 |
| 2017/0025075 | A1 | 1/2017 | Cok et al. | |
| 2017/0084671 | A1* | 3/2017 | Hack | H01L 27/3213 |
| 2018/0138357 | A1* | 5/2018 | Henley | H01L 33/0079 |
| 2018/0182279 | A1* | 6/2018 | Sakariya | G09G 3/2018 |
| 2018/0247586 | A1* | 8/2018 | Vahid Far | G09G 3/3216 |

FOREIGN PATENT DOCUMENTS

| | | |
|---|---|---|
| CN | 101267701 | 9/2008 |
| CN | 101737641 | 6/2010 |
| CN | 101616528 | 5/2011 |
| CN | 102257880 | 11/2011 |
| CN | 104167181 | 11/2014 |
| CN | 104936353 | 9/2015 |
| CN | 106531771 | 3/2017 |
| CN | 106876408 | 6/2017 |

* cited by examiner

MICRO LIGHT EMITTING DIODE DISPLAY PANEL AND DRIVING METHOD THEREOF

CROSS-REFERENCE TO RELATED APPLICATION

This application claims the priority benefit of Taiwan application serial no. 106130555, filed on Sep. 7, 2017. The entirety of the above-mentioned patent application is hereby incorporated by reference herein and made a part of this specification.

BACKGROUND OF THE INVENTION

Field of the Invention

The invention is related to a display panel and a driving method thereof, and particularly to a micro light emitting diode display panel and a driving method thereof.

Description of Related Art

Along with evolution of photoelectric technologies, the solid-state lighting (e.g., the light emitting diode) has been widely used in various fields such as road illumination, large outdoor board, traffic signals and so on. Recently, a micro light emitting diode display panel has been further developed which uses micro light emitting diodes with different colors as sub-pixels in the display panel.

In high-resolution or large-size micro light emitting diode display panels, the circuit is easily damaged by heat due to high driving current density. In addition, when using small current to drive the micro light emitting diode, the light wavelength of the micro light emitting diode becomes shorter as the driving current density is increased and the display image may be get worse under the impact of color shift.

FIG. 1 is a relationship diagram of a current density and a wavelength of a micro light emitting diode. Taking a green micro light emitting diode as an example, as shown in FIG. 1, when using small current (e.g., with current density less than 5 A/cm$^2$) to drive the green micro light emitting diode, the wavelength of the green micro light emitting diode becomes smaller as the driving current increases; as a result, the green light output by the green micro light emitting diode becomes bluer as the gray level increases (current density increases), and the wavelength of the green light cannot be consistent under different gray levels. Therefore, it is an issue for persons skilled in the art to find out how to improve the color shift problem caused by change of current density.

SUMMARY OF THE INVENTION

The invention provides a micro light emitting diode display panel and a driving method thereof, which are capable of improving color shift problem caused by change of current density.

In the invention, a micro light emitting diode display panel includes a plurality of pixels and a control element. One of the pixels include a first sub-pixel. The first sub-pixel includes two micro light emitting diodes having different light wavelengths and controlled independently. The control element controls driving currents to the two micro light emitting diodes according to a gray level of the first sub-pixel, wherein a ratio of the driving current of the micro light emitting diode with larger light wavelength to the driving current of the micro light emitting diode with smaller light wavelength increases as the gray level of the first sub-pixel increases.

In an embodiment of the invention, a light wavelength difference between the two micro light emitting diodes ranges from 1 nm to 10 nm.

In an embodiment of the invention, current densities of the two micro light emitting diodes are smaller than 3 A/cm$^2$ respectively.

In an embodiment of the invention, only the micro light emitting diode with smaller light wavelength of the first sub-pixel emits light when the first sub-pixel is in minimum gray level, and only the micro light emitting diode with larger light wavelength of the first sub-pixel emits light when the first sub-pixel is in maximum gray level.

In an embodiment of the invention, the first sub-pixel is a green sub-pixel, and the two micro light emitting diodes are green micro light emitting diodes.

In an embodiment of the invention, the one of the pixels further comprises a second sub-pixel and a third sub-pixel, and the first sub-pixel, the second sub-pixel and the third sub-pixel are with different colors.

In an embodiment of the invention, the third sub-pixel only comprises one micro light emitting diode, and the second sub-pixel comprises two micro light emitting diodes having different light wavelengths and controlled independently. The control element controls driving currents to the two micro light emitting diodes of the second sub-pixel according to a gray level of the second sub-pixel, wherein a ratio of the driving current of the micro light emitting diode with larger light wavelength to the driving current of the micro light emitting diode with smaller light wavelength increases as the gray level of the second sub-pixel increases.

In an embodiment of the invention, the first sub-pixel, the second sub-pixel and the third sub-pixel are respectively a green sub-pixel, a red sub-pixel and a blue sub-pixel. The red sub-pixel comprises two red micro light emitting diodes controlled independently and with different light wavelengths. The control element controls driving currents to the two red micro light emitting diodes according to a gray level of the red sub-pixel, wherein a ratio of the driving current of the red micro light emitting diode with larger light wavelength to the driving current of the red micro light emitting diode with smaller light wavelength increases as the gray level of the red sub-pixel increases, the blue sub-pixel comprises two blue micro light emitting diodes controlled independently and with different light wavelengths, the control element controls driving currents to the two blue micro light emitting diodes according to a gray level of the blue sub-pixel, wherein a ratio of the driving current of the blue micro light emitting diode with larger light wavelength to the driving current of the blue micro light emitting diode with smaller light wavelength increases as the gray level of the blue sub-pixel increases.

In the invention, a driving method of a micro light emitting diode display panel includes steps as follow. First of all, a micro light emitting diode display panel is provided, which has a plurality of pixels and at least one control element electrically connected to the plurality of pixels, wherein one of the plurality of pixels include a first sub-pixel. The first sub-pixel includes two micro light emitting diodes controlled independently and with different light wavelengths. Secondly, the control element respectively controls driving currents to the two micro light emitting diodes according to a gray level of the first sub-pixel, wherein a ratio of the driving current of the micro light emitting diode with larger light wavelength to the driving current of the micro light emitting diode with smaller light wavelength increases as the gray level of the first sub-pixel increases.

In an embodiment of the invention, the driving current of the micro light emitting diode with larger light wavelength is I2, and the driving current of the micro light emitting diode with smaller light wavelength is I1. A ratio of I1 to I2 satisfies the equation I1/I2=(W2−W)/(W−W1), wherein W is a target peak wavelength of the first sub-pixel, W1 and W2 are peak wavelengths of the two micro light emitting diodes respectively when the two micro light emitting diodes are driven by I1 and I2, and W1<W2.

In an embodiment of the invention, current densities of the two micro light emitting diodes are smaller than 3 A/cm² respectively.

In summary, according to the invention, in the micro light emitting diode display panel and the driving method thereof, the first sub-pixel has two micro light emitting diodes with different light wavelengths, and the ratio of the driving currents of the two micro light emitting diodes changes along with the gray level, such that the consistency of the dominant wavelength and light intensity can be maintained under different gray levels. Accordingly, the micro light emitting diode display panel and the driving method thereof are capable of improving color shift problem caused by change of current density in the micro light emitting diodes.

In order to make the aforementioned features and advantages of the disclosure more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2:
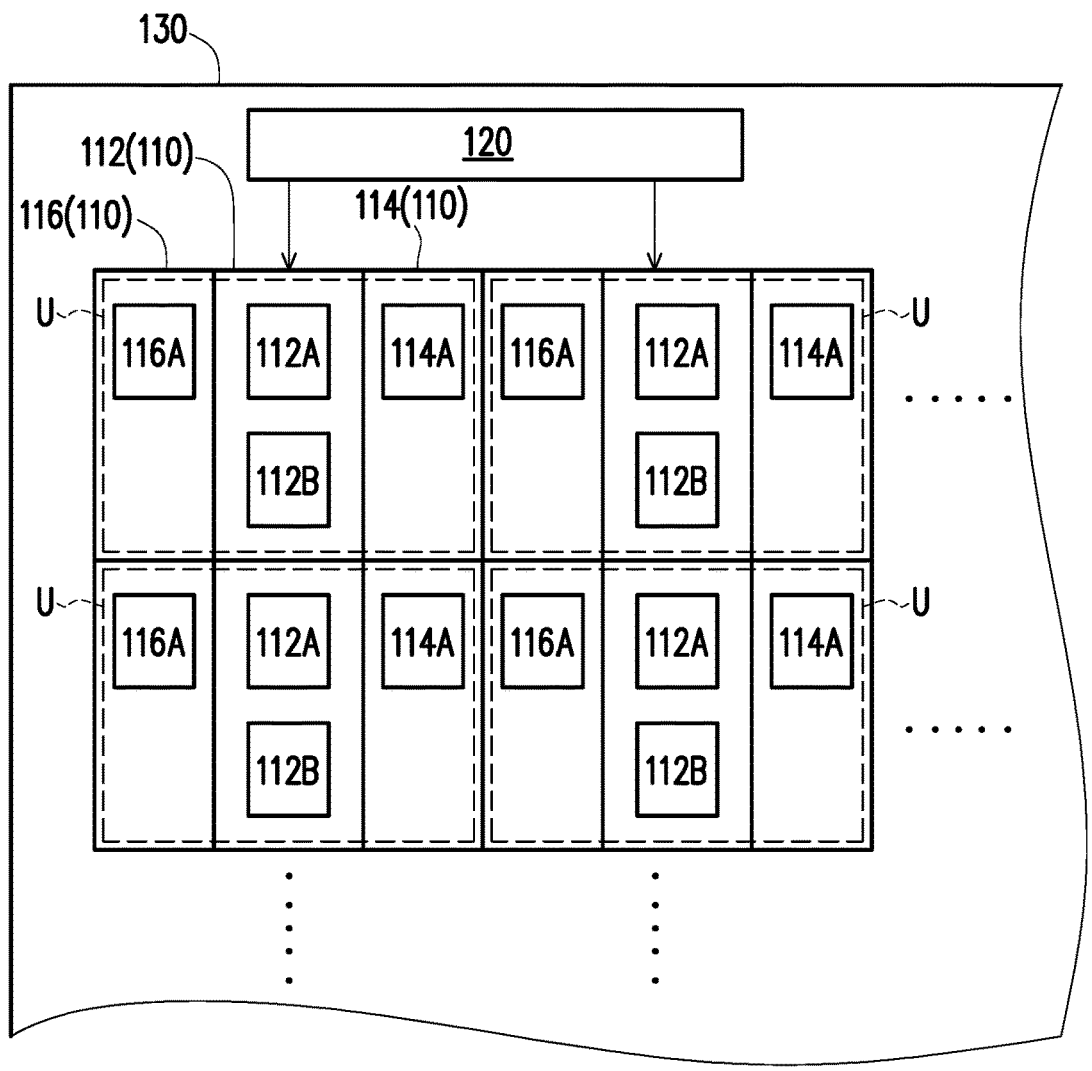
FIG. 2 is a partial top view of a micro light emitting diode display panel according to a first embodiment of the invention.

FIG. 2 is a partial top view of a micro light emitting diode display panel according to a first embodiment of the invention. Referring to FIG. 2, a micro light emitting diode display panel 100 in the first embodiment of the invention includes a plurality of pixels U and a control element 120.

Each pixel U at least include a first sub-pixel 112. The first sub-pixel 112 includes a micro light emitting diode 112A and a micro light emitting diode 112B. The micro light emitting diode 112A and the micro light emitting diode 112B may have the same size so as to facilitate bonding process, which should not be construed as a limitation to the invention.

Figure 3:
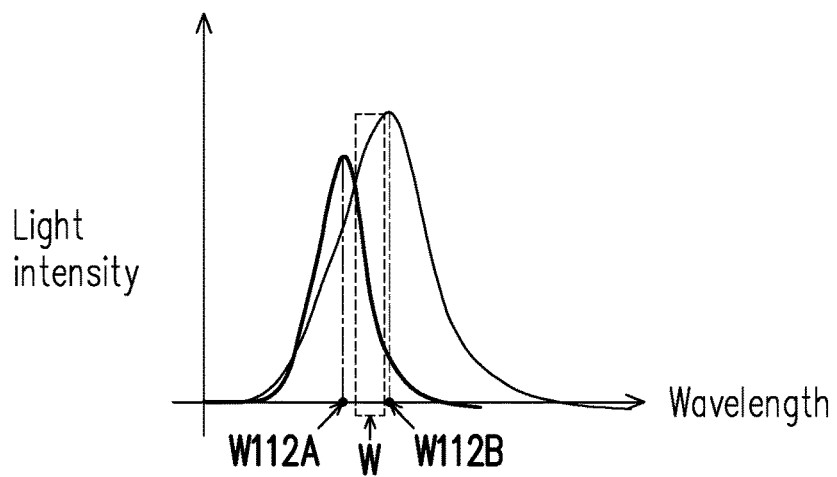
FIG. 3 is a schematic view of a wavelength and light intensity of two micro light emitting diodes in a first sub-pixel of FIG. 2.

The micro light emitting diode 112A and the micro light emitting diode 112B are electrically independent of each other and have different light wavelengths. Here, the light wavelength refers to a wavelength corresponding to a maximum light intensity in a spectrum of the micro light emitting diode. FIG. 3 is a schematic view of a wavelength and light intensity of two micro light emitting diodes 112A and 112B in the first sub-pixel 112 of FIG. 2 at a target gray level. Referring to FIG. 2 and FIG. 3, a spectrum of the micro light emitting diode 112B and a spectrum of the micro light emitting diode 112A are partially overlapped, and a light wavelength W112B of the micro light emitting diode 112B is larger than a light wavelength W112A of the micro light emitting diode 112A. In an embodiment, a difference of the light wavelength W112A of the micro light emitting diode 112A and the light wavelength W112B of the micro light emitting diode 112B ranges from 1 nm to 10 nm, and preferably ranges from 3 nm to 5 nm.

The control element 120 is electrically connected to the micro light emitting diode 112A and the micro light emitting diode 112B in the first sub-pixel 112, so as to control driving currents to the micro light emitting diode 112A and the micro light emitting diode 112B according to a gray level of the first sub-pixel 112. In the first embodiment, the control element 120 is disposed on one side of the plurality of pixels U, and the control element 120 controls the driving current to each of the pixels U through connected wires (not shown). In other embodiments, a plurality of control elements 120 may be correspondingly disposed among the pixels U.

In the first sub-pixel 112, the ratio of the driving current of the micro light emitting diode 112B with larger light wavelength to the driving current of the micro light emitting diode 112A with smaller wavelength increases as the gray level of the first sub-pixel 112 increases.

Specifically, the driving method of the sub-pixel of the micro light emitting diode display panel 100 satisfies equation 1:

$$I1*(\Delta W2/\Delta W)+I2*(\Delta W1/\Delta W)=I \qquad \text{Equation 1}$$

wherein $\Delta W2=W2-W$, $\Delta W1=W-W1$, and $\Delta W=W2-W1$.

The symbols used in the above relationship equation represents the following:

W: target peak wavelength ($\lambda_p$);
I1 and I2: driving currents of the micro light emitting diode 112A and the micro light emitting diode 112B;
I: current required when the first sub-pixel 112 is at the target gray level, wherein I1+I2 is equal to or close to I; and
W1 and W2: peak wavelengths ($\lambda_p$) of the micro light emitting diode 112A and micro light emitting diode 112B. In addition, a ratio of I1 to I2 satisfies I1/I2=(W2−W)/(W−W1). Alternately, in another embodiment, W can be the target dominate wavelength (or target centroid wavelength), while W1 and W2 are respectively dominate wavelengths (or centroid wavelengths) of the micro light emitting diode 112A and micro light emitting diode 112B.

Figure 1:
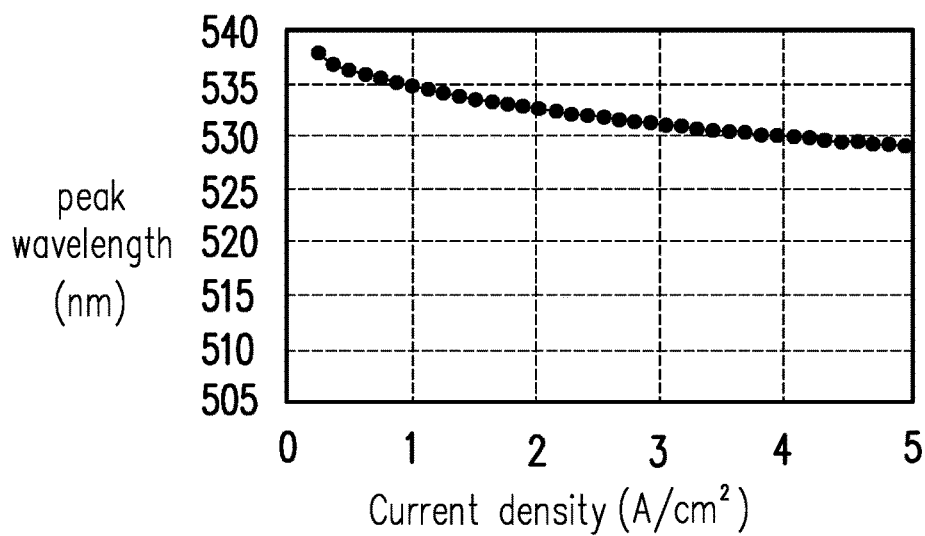
FIG. 1 is a relationship diagram of a current density and a wavelength of a micro light emitting diode.

According to FIG. 1, the larger the current density of the micro light emitting diode, the wavelength shifts to the smaller wavelength. In other words, when the gray level of the pixel becomes higher, the wavelength of the light beam emitted by the micro light emitting diode becomes smaller. Therefore, in the first sub-pixel 112 of the embodiment, the driving current ratio of the micro light emitting diode 112A with smaller light wavelength and the micro light emitting diode 112B with larger light wavelength decreases as the gray level increases. At low gray level, the dominant wavelength of the light emitted by the first sub-pixel 112 is mainly dominated by the micro light emitting diode 112A with smaller light wavelength. As the gray level increases, the dominant wavelength of the light emitted by the first sub-pixel 112 may be increased by increasing the current density of the micro light emitting diode 112B with larger light wavelength. At high gray level, the light wavelength of the light emitted by the first sub-pixel 112 is mainly dominated by the micro light emitting diode 112B with larger light wavelength, and the light wavelength of the light emitted by the first sub-pixel 112 may be adjusted by the micro light emitting diode 112A with smaller light wavelength. In an embodiment, only the micro light emitting diode 112A with smaller light wavelength of the first sub-pixel 112 emits light when the first sub-pixel 112 is in minimum gray level (darkest). In addition, only the micro light emitting diode 112B with larger light wavelength of the first sub-pixel 112 emits light when the first sub-pixel 112 is in maximum gray level (brightest).

Because of disposing two micro light emitting diodes with different wavelength in one of the first sub-pixel 112, the dominant wavelength can be controlled by changing the driving current ratio between the two micro light emitting diodes with different light wavelengths according to the gray level, and the current density of each of the micro light emitting diodes can be reduced. Since the smaller the change of the current density, the smaller the shifting of the light wavelength (as shown in FIG. 1), the color shift of each of the first sub-pixel 112 can be improved by substituting a single micro light emitting diode with the plurality of micro light emitting diodes with different light wavelengths. In this manner, the consistency of the light wavelength and the light intensity can be maintained under different gray level. In an embodiment, the current densities of the two micro light emitting diodes 112A and 112B are smaller than 3 A/cm$^2$ respectively, thereby improving the color shift problem.

In the micro light emitting diode display panel 100, each of the pixels U further include a second sub-pixel 114 and a third sub-pixel 116. The first sub-pixel 112, the second sub-pixel 114 and the third sub-pixel 116 are sub-pixels 110 with different colors (such as red sub-pixel, green sub-pixel and blue sub-pixel). In this manner, the micro light emitting diode display panel 100 may display images in full-color.

The plurality of pixel U arranged in array to show image (FIG. 2 merely schematically illustrates four pixels U). In addition, although FIG. 2 simply illustrates four display units U electrically connected to one control element 120, what is shown in FIG. 2 should not be construed as a limitation to the invention. In another embodiment, one pixel U or thousands of pixels U may be connected to one control element 120.

The control element 120 controls the status (light emission, non-emission of light or light emission intensity) of each sub-pixel 110. For example, the control element 120 may be a microchip, and the control element 120 and the micro light emitting diodes are bonded on a substrate 13. The substrate 130 may be a printed circuit board (PCB), a flexible printed circuit board (FPCB), a glass plate having wirings or a ceramic substrate having wirings.

In the embodiment, there is only one micro light emitting diode (e.g., micro light emitting diode 114A) in the second sub-pixel 114, and there is only one micro light emitting diode (e.g., micro light emitting diode 116A) in the third sub-pixel 116. The control element 120 is further electrically connected to the micro light emitting diode 114A in the second sub-pixel 114 and the micro light emitting diode 116A in the third sub-pixel 116 so as to control the emission status of the micro light emitting diode 114A and the micro light emitting diode 116A.

For example, the first sub-pixel 112, the second 114 and the third sub-pixel 116 may be the green sub-pixel, the red sub-pixel and the blue sub-pixel respectively. In other words, the micro light emitting diode 112A and the micro light emitting diode 112B are green micro light emitting diodes, the micro light emitting diode 114A is a red micro light emitting diode, and the micro light emitting diode 116A is a blue micro light emitting diode. Among the red light, the green light and the blue light, since human eyes are most sensitive to the green light (looks brighter under the same brightness), the color shift problem (blue shift) is significantly noticed for the green micro light emitting diode. In the embodiment, by configuring two green micro light emitting diodes with different light wavelengths in the green sub-pixel, and the ratio of the driving current of the two green micro light emitting diodes changes along with the gray level, the consistency of the light wavelength and the light intensity of the green light under different gray levels can be maintained, and therefore the micro light emitting diode display panel 100 can have good display quality. In another embodiment, the first sub-pixel 112, the second sub-pixel 114 and the third sub-pixel 116 may be a blue sub-pixel, a green sub-pixel and a red sub-pixel respectively, or a red sub-pixel, a green sub-pixel and a blue sub-pixel respectively.

Although the first embodiment discloses that the above method for improving color shift (by disposing two micro light emitting diodes with different light wavelengths in at least one sub-pixel of each pixel, and the ratio of the driving current of the two micro light emitting diodes changes along with gray level) is only applied in one color of sub-pixel (first sub-pixel 112), which should not be construed as limitation to the invention. In another embodiment, the method for improving color shift may also be applied in the second sub-pixel 114 and the third sub-pixel 116.

Figure 4:
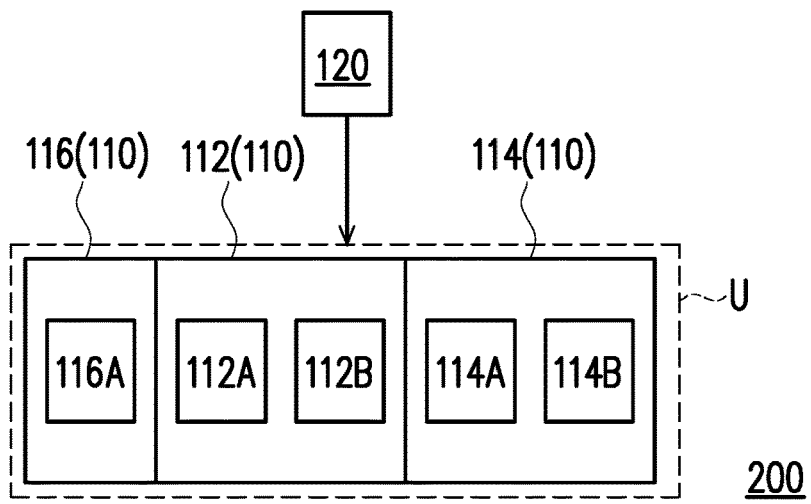
FIG. 4 and FIG. 5 are respectively partial top views of micro light emitting diode display panels in a second embodiment and a third embodiment of the invention.
Figure 5:
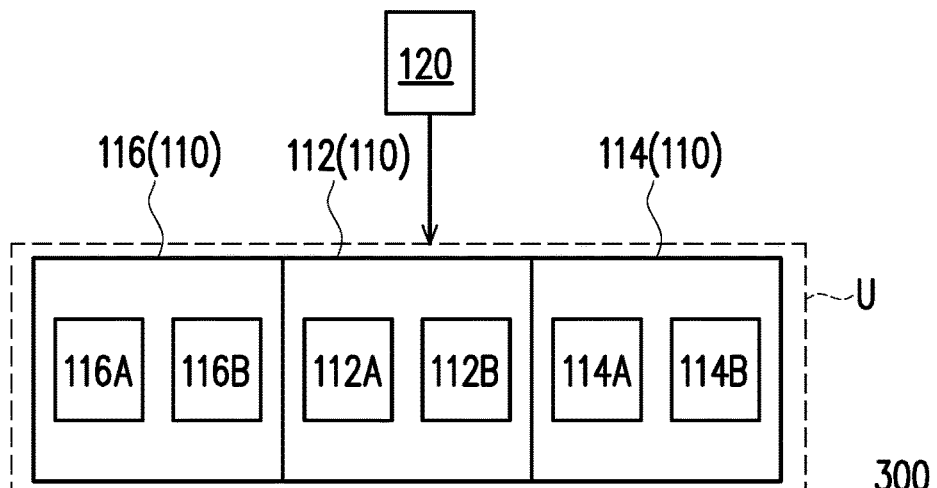

FIG. 4 and FIG. 5 are respectively partial top views of micro light emitting diode display panels in a second embodiment and a third embodiment of the invention. Specifically, FIG. 4 and FIG. 5 respectively omit illustration of the substrate and only schematically shows one pixel U. Referring to FIG. 4, a micro light emitting diode display panel 200 in FIG. 4 is similar to the micro light emitting diode display panel 100 in FIG. 2, wherein the same elements are denoted by the same reference numerals, and no repetition is incorporated herein. The major difference between the two is that the second sub-pixel 114 has two micro light emitting diodes 114A and 114B with different light wavelengths in the micro light emitting diode display panel 200 for improving color shift.

Specifically, in the micro light emitting diode display panel 200, the second sub-pixel 114 (e.g., red sub-pixel) includes the micro light emitting diode 114A and the micro light emitting diode 114B. The micro light emitting diode 114A and the micro light emitting diode 114B may have the same size so as to facilitate bonding process, which should not be construed as a limitation to the invention.

In the embodiment, the micro light emitting diode 114A and the micro light emitting diode 114B are red micro light emitting diodes. The two red micro light emitting diodes are electrically independent of each other and have different light wavelengths. The control element 120 is electrically connected to the micro light emitting diode 114A and the micro light emitting diode 114B so as to control driving currents to drive the two red micro light emitting diodes (micro light emitting diode 114A and micro light emitting diode 114B) according to a gray level of the second sub-pixel 114 (red sub-pixel), wherein a ratio of the driving current of the red micro light emitting diode 114A with larger light wavelength to the driving current of the red micro light emitting diode 114B with smaller light wavelength increases as the gray level of the second sub-pixel increases.

Referring to FIG. 5, a micro light emitting diode display panel 300 in FIG. 5 is similar to the micro light emitting diode display panel 200 in FIG. 4, wherein the same elements are denoted by the same reference numerals, and no repetition is incorporated herein. The major difference between the two is that the third sub-pixel 116 has two micro light emitting diodes 116A and 116B with different light wavelengths in the micro light emitting diode display panel 300 for improving color shift.

Specifically, in the micro light emitting diode display panel 300, the third sub-pixel 116 (e.g., blue sub-pixel) includes the micro light emitting diode 116A and the micro light emitting diode 116B. The micro light emitting diode 116A and the micro light emitting diode 116B may have the same size so as to facilitate the bonding process, which should not be construed as a limitation to the invention.

In the embodiment, the micro light emitting diode 116A and the micro light emitting diode 116B are blue micro light emitting diodes. The two blue micro light emitting diodes 116A and 116B are electrically independent of each other and controlled respectively. The micro light emitting diode 116A and the micro light emitting diode 116B have different light wavelengths in a same driving current, for example, the light wavelength of the micro light emitting diode 116A is larger than that of the micro light emitting diode 116B. The control element 120 is electrically connected to the micro light emitting diode 116A and the micro light emitting diode 116B so as to control driving currents to the two blue micro light emitting diodes (micro light emitting diode 116A and micro light emitting diode 116B) according to a gray level of the third sub-pixel 116 (blue sub-pixel), wherein a ratio of the driving current in the blue micro light emitting diode 116A to the driving current in the blue micro light emitting diode 116B increases as the gray level of the third sub-pixel 116 increases.

In summary, in the micro light emitting diode display panel of the invention, at least one sub-pixel has two micro light emitting diodes with different light wavelengths (but have the same color), and the ratio of the driving currents of the two micro light emitting diodes changes along with the gray level, such that the consistency of the dominant wavelength can be maintained under different gray levels. In this manner, the micro light emitting diode display panel can improve the color shift problem due to current density change of the micro light emitting diodes. In an embodiment, the above-mentioned method for improving color shift may also be applied to at least one of the second sub-pixel and the third sub-pixel. In addition, in each of the pixels, the arrangement of the sub-pixels with different colors, the size, and number of micro light emitting diode in each of the sub-pixels may vary according to requirement and are not limited to the illustration in FIGS. 2, 4 and 5.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A micro light emitting diode display panel, comprising:
   a plurality of pixels, wherein one of the pixels comprises a first sub-pixel that comprises two micro light emitting diodes having different light wavelengths and controlled independently; and
   a control element, controlling driving currents to the two micro light emitting diodes according to a gray level of the first sub-pixel, wherein a ratio of the driving current of the micro light emitting diode with larger light wavelength to the driving current of the micro light emitting diode with smaller light wavelength increases as the gray level of the first sub-pixel increases.

2. The micro light emitting diode display panel according to claim 1, wherein a light wavelength difference between the two micro light emitting diodes ranges from 1 nm to 10 nm.

3. The micro light emitting diode display panel according to claim 1, wherein current densities of the two micro light emitting diodes are smaller than 3 A/cm$^2$ respectively.

4. The micro light emitting diode display panel according to claim 1, wherein only the micro light emitting diode with smaller light wavelength of the first sub-pixel emits light when the first sub-pixel is in minimum gray level, and only the micro light emitting diode with larger light wavelength of the first sub-pixel emits light when the first sub-pixel is in maximum gray level.

5. The micro light emitting diode display panel according to claim 1, wherein the first sub-pixel is a green sub-pixel and the two micro light emitting diodes are green micro light emitting diodes.

6. The micro light emitting diode display panel according to claim 1, wherein the one of the pixels further comprises a second sub-pixel and a third sub-pixel, and the first sub-pixel, the second sub-pixel and the third sub-pixel are with different colors.

7. The micro light emitting diode display panel according to claim 6, wherein the third sub-pixel only comprises one micro light emitting diode, the second sub-pixel comprises two micro light emitting diodes having different light wavelengths and controlled independently, and the control element controls driving currents to the two micro light emitting diodes of the second sub-pixel according to a gray level of the second sub-pixel, wherein a ratio of the driving current of the micro light emitting diode with larger light wavelength to the driving current of the micro light emitting diode with smaller light wavelength increases as the gray level of the second sub-pixel increases.

8. The micro light emitting diode display panel according to claim 6, wherein the first sub-pixel, the second sub-pixel and the third sub-pixel are respectively a green sub-pixel, a red sub-pixel and a blue sub-pixel, the red sub-pixel comprises two red micro light emitting diodes controlled independently and with different light wavelengths, the control element controls driving currents to the two red micro light emitting diodes according to a gray level of the red sub-pixel, wherein a ratio of the driving current of the red micro light emitting diode with larger light wavelength to the driving current of the red micro light emitting diode with smaller light wavelength increases as the gray level of the red sub-pixel increases, the blue sub-pixel comprises two blue micro light emitting diodes controlled independently and with different light wavelengths, the control element controls driving currents to the two blue micro light emitting diodes according to a gray level of the blue sub-pixel, wherein a ratio of the driving current of the blue micro light emitting diode with larger light wavelength to the driving current of the blue micro light emitting diode with smaller light wavelength increases as the gray level of the blue sub-pixel increases.

9. A driving method of a micro light emitting diode display panel, comprising:
providing a micro light emitting diode display panel, having a plurality of pixels and at least a control element electrically connected to the pixels, wherein one of the pixels comprise a first sub-pixel that comprises two micro light emitting diodes controlled independently and with different light wavelengths; and
controlling driving currents to the two micro light emitting diodes via the control element according to a gray level of the first sub-pixel, wherein a ratio of the driving current of the micro light emitting diode with larger light wavelength to the driving current of the micro light emitting diode with smaller light wavelength increases as the gray level of the first sub-pixel increases.

10. The driving method of the micro light emitting diode display panel according to claim 9, wherein the driving current of the micro light emitting diode with larger light wavelength is I2, the driving current of the micro light emitting diode with smaller wavelength is I1, a ratio of I1 to I2 satisfies:

$$I1/I2=(W2-W)/(W-W1);$$

wherein W is a target peak wavelength of the first sub-pixel, W1 and W2 are peak wavelengths of the two micro light emitting diodes respectively when the two micro light emitting diodes are driven by I1 and I2, and W1<W2.

11. The driving method of the micro light emitting diode display panel according to claim 9, wherein current densities of the two micro light emitting diodes are smaller than 3 A/cm$^2$ respectively.

* * * * *